United States Patent [19]

Kerth

[11] Patent Number: 5,268,651
[45] Date of Patent: Dec. 7, 1993

[54] LOW DRIFT RESISTOR STRUCTURE

[75] Inventor: Donald A. Kerth, Austin, Tex.

[73] Assignee: Crystal Semiconductor Corporation, Austin, Tex.

[21] Appl. No.: 18,358

[22] Filed: Feb. 16, 1993

Related U.S. Application Data

[63] Continuation of Ser. No. 764,334, Sep. 23, 1991, abandoned.

[51] Int. Cl.$^5$ .............................................. H03F 3/191
[52] U.S. Cl. ..................................... 330/307; 330/295
[58] Field of Search ................ 330/307, 295; 338/307, 338/314; 307/303; 357/51

[56] References Cited

U.S. PATENT DOCUMENTS

| | | | |
|---|---|---|---|
| 3,666,995 | 5/1972 | Wensink et al. | 317/101 A |
| 4,028,718 | 6/1977 | Migitaka et al. | 357/27 |
| 4,181,878 | 1/1980 | Murari et al. | 323/94 R |
| 4,245,209 | 1/1981 | Bertotti et al. | 338/217 |
| 4,703,302 | 10/1987 | Hino et al. | 338/307 |
| 4,904,951 | 2/1990 | Molina et al. | 330/307 |
| 5,047,827 | 9/1991 | Clark, Jr. et al. | 357/51 |

FOREIGN PATENT DOCUMENTS 1416220 12/1975 United Kingdom .

OTHER PUBLICATIONS

Holloway, Peter, "Trimless 16B Digital Potentiometer," 1984 IEEE International Solid-State Circuits Conference, Feb. 22, 1984 pp. 66-67, 320-321.

Dorler, et al., "Integrated Resistor Contacts," IBM Technical Disclosure Bulletin, vol. 15, Apr. 1973, p. 3383.

Ting, et al., "A Study of the Contacts of A Diffused Resistor," Solid-State Electronics, vol. 14, pp. 433-438, Nov. 25, 1970.

Primary Examiner—Steven Mottola
Assistant Examiner—Tan Dinh
Attorney, Agent, or Firm—Robert D. Lott

[57] ABSTRACT

A low drift integrated circuit resistor structure has a forced high end and a forced low end. A sense high connection is located proximate to the force high connection, and a sense low connection is located proximate to the force low connection. The structure also has at least one internal sense connection. This structure can be used in an instrumentation amplifier that includes an operational amplifier which regulates the current between the force high connection and the force low connection in response, in part, to the current sensed in the internal sensing connection of the resistor structure. The sense high connection and the sense low connection form the outputs of the instrumentation amplifier.

10 Claims, 3 Drawing Sheets

LOW DRIFT RESISTOR STRUCTURE

This is a continuation of copending application Ser. No. 07/764,334, filed on Sep. 23, 1991, now abandoned.

TECHNICAL FIELD

The present invention pertains to resistor structures, and more particularly, to low drift resistor structures.

BACKGROUND OF THE INVENTION

Highly linear and stable instrumentation amplifiers are required in certain applications such as the amplification of signals from thermocouples, strain-gauges, and thermistors.

Present day amplifiers have a preset gain which varies with temperature on the order of four or five parts per million per degree Celsius (ppm/° C.) To provide some perspective as to the significance of a drift of 4 ppm/° C., in a 12-bit digital system, one half of the least significant bit is equivalent to 128 ppm, and in a 16-bit digital system, one half of the least significant bit is equivalent to 8 ppm. An amplifier with a 4 ppm/° C. which operates in a temperature range of 0° to 70° C. can have a drift of 280 ppm over the temperature range.

Such instrumentation amplifiers generally consist of operational amplifiers and resistors. Since the gains of operational amplifiers available today is in excess of a million, the predominant drift producing mechanisms are the gain setting resistors.

Therefore, it can be appreciated that a resistor structure which provides significantly less drift in an instrumentation amplifier type of circuit is highly desirable.

SUMMARY OF THE INVENTION

It is, therefore, an object of this invention to provide a resistor structure in an instrumentation amplifier type of circuit which has significantly less drift than prior art resistor structures.

Shown in an illustrated embodiment of the invention is a low drift integrated circuit resistor structure which includes a homogeneous resistive element formed in a first layer of the integrated circuit, the resistive element having a first end and a second end. The resistive element has a first sensing connection and a second sensing connection, the first sensing connection located proximate to the first end, and the second sensing connection located proximate to the second end. The resistor structure includes at least one additional sensing connection to the resistive element which is located between the first and the second sensing connections. At least one of the first, second, and the at least one additional sensing connection has a contact to at least one additional layer of the integrated circuit.

In a further aspect the resistor structure includes circuitry coupled to the resistive element for passing a current through the resistive element. The circuitry is coupled to and responsive to the voltage on at least one of the sensing connections, the circuitry controlling the current through the resistor structure.

In another aspect, the circuitry includes a first operational amplifier having an output coupled to the first end of the resistor structure, with the first sensing connection forming a first output terminal. The second end of the resistor structure is coupled to the output of a second operational amplifier and the second sensing connection forms a second output terminal. The at least one additional sensing connection is coupled to a first input of the first operational amplifier, and a fourth sensing connection to the resistive element, which is positioned between said at least one additional sensing connection and the second sensing connection, is coupled to a first input of the second operational amplifier. A second input of the first operational amplifier receives a first input signal, and a second input of the second operational amplifier receives a second input signal.

BRIEF DESCRIPTION OF THE DRAWINGS

The aforementioned and other features, characteristics, advantages, and the invention in general, will be better understood from the following, more detailed description taken in conjunction with the accompanying drawing in which.

Figure 1A:
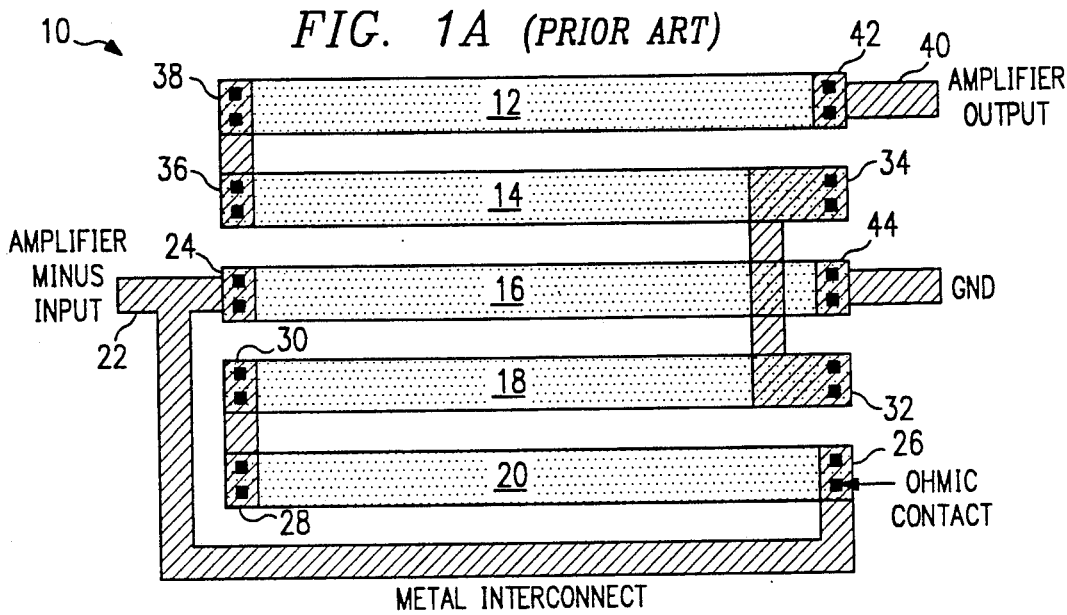
FIG. 1A is a plan view of a prior art resistor structure.

It will be appreciated that for purposes of clarity and where deemed appropriate, reference numerals have been repeated in the figures to indicate corresponding features, and that the drawings of the resistor structures have not necessarily been drawn to scale in order to more clearly show the important aspects of the invention.

DESCRIPTION OF THE PREFERRED EMBODIMENT

Upon examination of prior art resistor structures and by a series of experiments, it was determined that the main temperature and aging drift mechanism in the ratio of the resistors in the resistor structure arose from the contacts of the resistive element to the metal layer. The present invention obviates the contact problem by controlling the current through the resistor structure using sensing connections which are low current connections and therefore not affected to any significant degree by the contacts in the sensing connections.

A resistor structure according to the preferred embodiment of the present invention has a first end or force high end and a second end or force low end. Placed next to or proximate to the force high end is a first sensing connection or sense high connection, and positioned close to or proximate to the force low end is a second sensing connection or sense low connection. There is also at least one other sensing connection located inside the resistor structure.

The contact drift problem is eliminated by forcing current through the resistive element between the force high and force low connections by a circuit which controls the current through the resistor structure in response to the voltage(s) appearing at the internal sensing connection(s). The outputs from the resistor structure are formed by the sense high connection and the sense low connection.

Turning now to the drawings, FIG. 1A is a prior art resistor structure 10 which includes a plurality of rows of resistive elements 12, 14, 16, 18, and 20. An amplifier minus input terminal on a metal line 22 is connected to the left hand end of the resistive element 16 by ohmic contact 24 and also to one end of the resistive element 20 by another ohmic contact 26. The resistive elements 20 and 18 are connected together by metallization through two ohmic contacts 28 and 30 respectively. Similarly, the resistive elements 18 and 14 are connected together by metallization through ohmic contacts 32 and 34 respectively and resistive elements 14 and 12 are connected together through metallization through two ohmic contacts 36 and 38. The other end of resistive element 12 is coupled to an amplifier output terminal 40 through an ohmic contact 42. The other end of resistive element 16 is connected to ground through an ohmic contact 44.

Figure 1B:
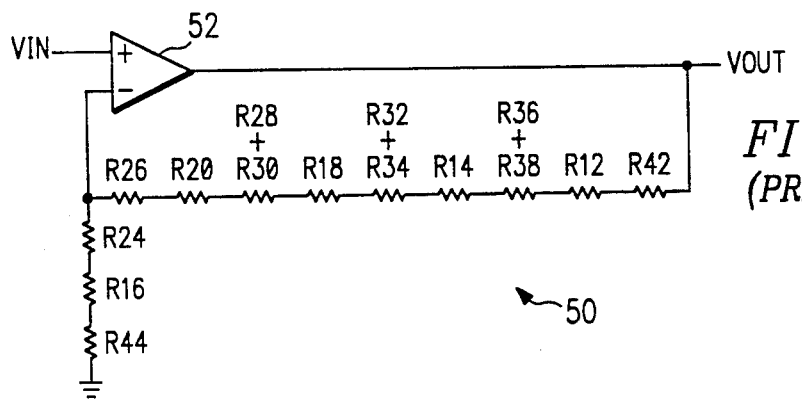
FIG. 1B is a schematic diagram of an operational amplifier using the resistor structure shown in FIG. 1A as the gain setting resistors.

FIG. 1B is a schematic diagram of an operational amplifier circuit 50 which includes an operational amplifier 52 which receives an input signal VIN at its plus input terminal and provides an output signal VOUT at its output terminal. Coupled between VOUT and the minus input of the operational amplifier are a series of resistors which consist of the resistive elements 12, 14, 18, and 20 shown as R12, R14, R18, and R20 respectively. The resistor also includes the resistance of the ohmic contacts shown as R42, R38, R36, R34, R32, R30, R28, and R26 corresponding to the ohmic contacts shown in FIG. 1A. The minus input of the operational amplifier 52 is coupled to ground with the resistive element 16 shown as R16 in FIG. 1B and also through the ohmic contacts R24 and R44 which are the respective resistances of the contacts 24 and 44 in FIG. 1A.

Therefore, the gain of the circuit 50 is shown as:

$$\text{GAIN} = \frac{VOUT}{VIN}$$

$$= 1 + \frac{R26 + R20 + R28 + R30 + R18 + R32 + R34 + R14 + R36 + R38 + R12 + R42}{R24 + R16 + R44}$$

It has been found that the structure shown in FIG. 1A, in which the resistive element is formed in polysilicon, that the gain drift ($\Delta G/\Delta T$) of this resistive element can be as much as 10 ppm/° C. for a temperature range of 25° C. to 125° C. and an additional 100 parts per million per month at 125° C. ambient. The main gain drift mechanism arises from the contacts between the resistive element and the metalization layer.

Figure 2:
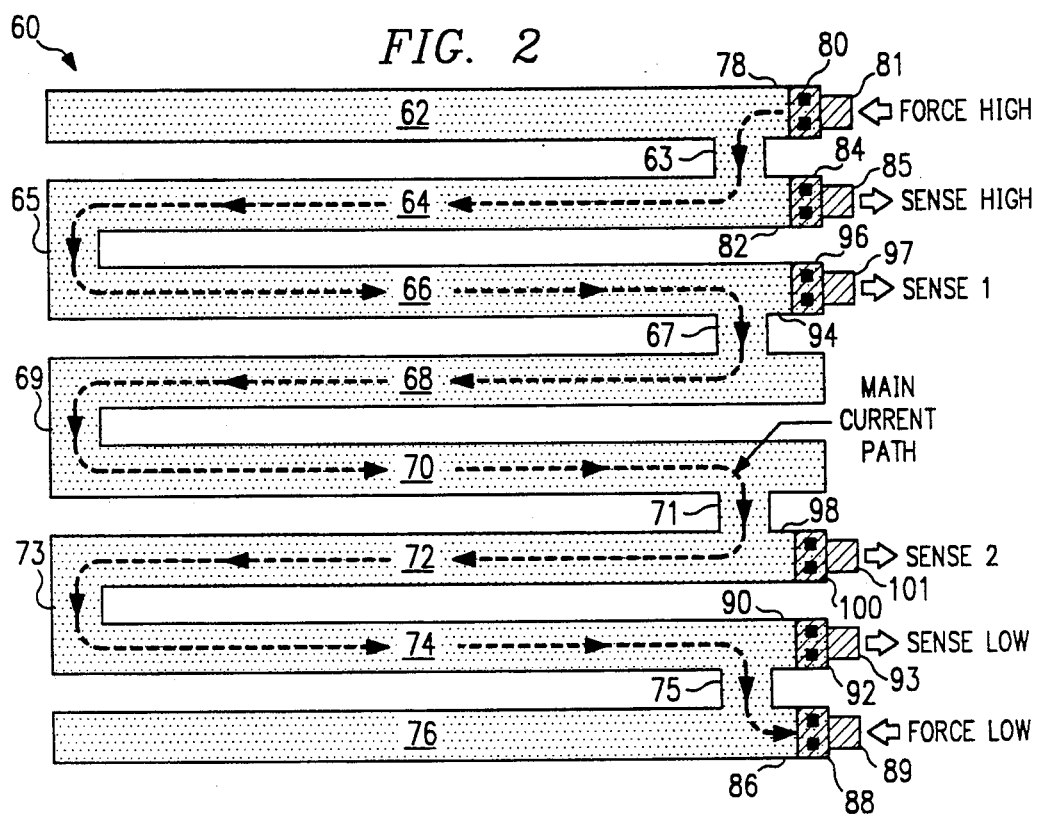
FIG. 2 is a first embodiment of a resistor structure according to the present invention.

A first embodiment, but not the preferred embodiment, of the present invention is shown in FIG. 2. FIG. 2 is a plan view of the resistor structure 60 according to the present invention which includes a plurality of rows of equal widths of resistive material 62, 64, 66, 68, 70, 72, 74, and 76. The rows of resistive material are connected at alternative ends by bridging bar connections 63 (between rows 62 and 64), 65 (between rows 64 and 66), 67 (between rows 66 and 68), 69 (between rows 68 and 70), 71 (between rows 70 and 72), 73 (between rows 72 and 74), and 75 (between rows 74 and 76). Therefore, the resistor structure 60 forms a serpentine pattern of homogeneous resistive material.

The top row, 62, of the resistor structure has a force high connection 78 at the end of the top row having the bridging bar 63. The force high connection 78 has an ohmic contact 80 to a metallization line 81. A sense high connection 82 is connected to the second row at the end of the second row having the bridging connection 63. The sense high connection 82 has an ohmic contact 84 to a metallization line 85.

The bottom row 76 has a force low connection 86 which is connected to the bottom row at the end of the bottom row connected to the bridging bar 75. The force low connection 86 has an ohmic contact 88 to a metallization line 89. The sense low connection 90 is connected to the next to bottom row 74 at the end of the row 74 connected to the bridging element 75. The sense low connection 90 has an ohmic contact 92 to a metallization line 93.

A first sensing connection 94 is connected to the row 66 at the end of the row 66 connected to the bridging bar 67. The first sensing connection 94 has an ohmic contact 96 to a metallization line 97. A second sensing connection 98 is connected to the row 72 at the end of the row 72 having the connecting bar 71. The second sensing connection 98 has an ohmic contact 100 to a metallization line 101.

In operation circuitry forces current along a main current path shown in FIG. 2 between the force high connection 78 and the force low connection 86. The current through the main current path is regulated in part by the voltage appearing at either the first sensing connection 94 or the second sensing connection 98 or a combination of both of these sensing voltages. (The current through the main current path is also determined by the input signal.) The outputs from the resistor structure shown in FIG. 2 is a voltage from the sense high connection 82 on metalization line 85 and the sense low connection 90 on the metalization line 93. The sensing connections 82, 90, 94, and 98, and their respective contacts 84, 92, 96, and 100 are positioned so that they are removed from, or outside, the main current path.

Figure 3:
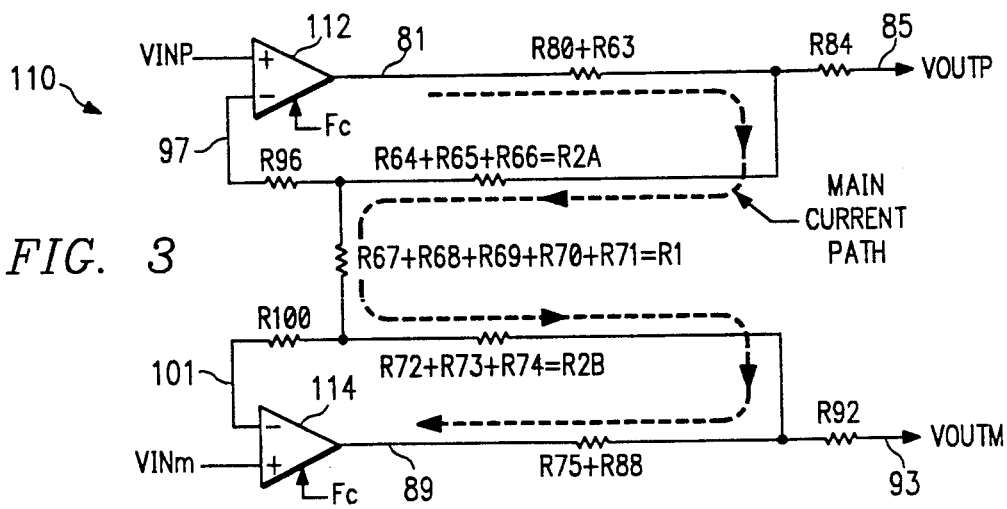
FIG. 3 is an instrumentation amplifier schematic diagram which uses the resistor structure of the present invention.

FIG. 3 is a schematic diagram of the preferred embodiment of the circuit to be used with the present invention. FIG. 3 shows an instrumentation amplifier 110 having a first operational amplifier 112 and a second operational amplifier 114. To improve the noise characteristics of the instrumentation amplifier 110, the operational amplifiers 112 and 114 are chopper stabilized in the preferred embodiment. The amplifiers are chopped by a chopping signal Fc shown in FIG. 3. The operational amplifier 112 receives a positive input signal VINP at its plus input terminal and has an output connected to the force high metalization line 81. The minus input of the operational amplifier 112 is connected to the metalization line 97 of the first sensing connection 94. The metalization line 85 of the sense high connection 82 forms the positive output VOUTP of the amplifier 110.

The operational amplifier 114 receives a minus input signal VINM at its plus input terminal and has an output connected to the force low metalization line 89. The metalization line 101 of the second sensing connection 98 is connected to the minus input of the operational amplifier 114. The metalization line 93 of the sense low connection 90 forms the minus output signal VOUTM.

In operation the instrumentation amplifier 110 shown in FIG. 3 is designed to drive a signal into a differential input circuit having high impedance inputs. Since each of the sensing contacts 84, 92, 96, and 100 are coupled to high impedance nodes, virtually no current flows through these contacts and the contact resistance is insignificant. Since the resistance of the force high contact 80 and the force low contact 88 is inside the feedback loop of the operational amplifiers 112 and 114, the effect of their resistance is negated by the feedback operation of the amplifiers. Therefore the gain of the instrumentation amplifier 110 is:

$$\text{GAIN} = \frac{VOUTP - VOUTM}{VINP - VINM} = 1 + \frac{R2A + R2B}{R1}$$

where R2A=R64+R65+R66
and R2B=R72+R73+R74
and R1=R67+R68+R69+R70+R71
Therefore the gain of the operational amplifier 110 is dependent only on the resistance of the homogeneous resistive element shown in FIG. 2 and is virtually independent of the contact resistances of the contacts 80, 84, 88, 92, 96, and 100.

A test structure of the resistor structure shown in FIG. 2 was built and tested. This resistor structure provides a gain drift of approximately 0.3 ppm/° C. for temperature spans of 25° C. to 125° C., and aging was found to be less than 10 parts per million per month at 125° C.

Note that in FIG. 2 the top row and the bottom row are not in the current path and therefore do not perform a direct electrical function of the resistor structure 60. However, the top row and the bottom row are useful during the formation of the resistor structure so that the etching seen by the rows 64 and 74 will be the same on both sides of rows 64 and 74 as will be the same for all of the internal rows.

Figure 4B:
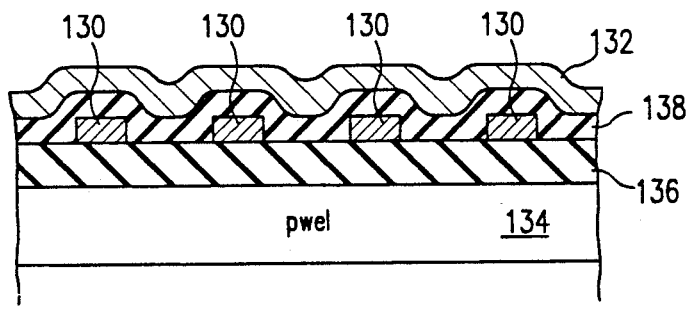
FIG. 4B is a cross sectional view of a portion of the resistor structure shown in FIG. 4A.
Figure 4A:
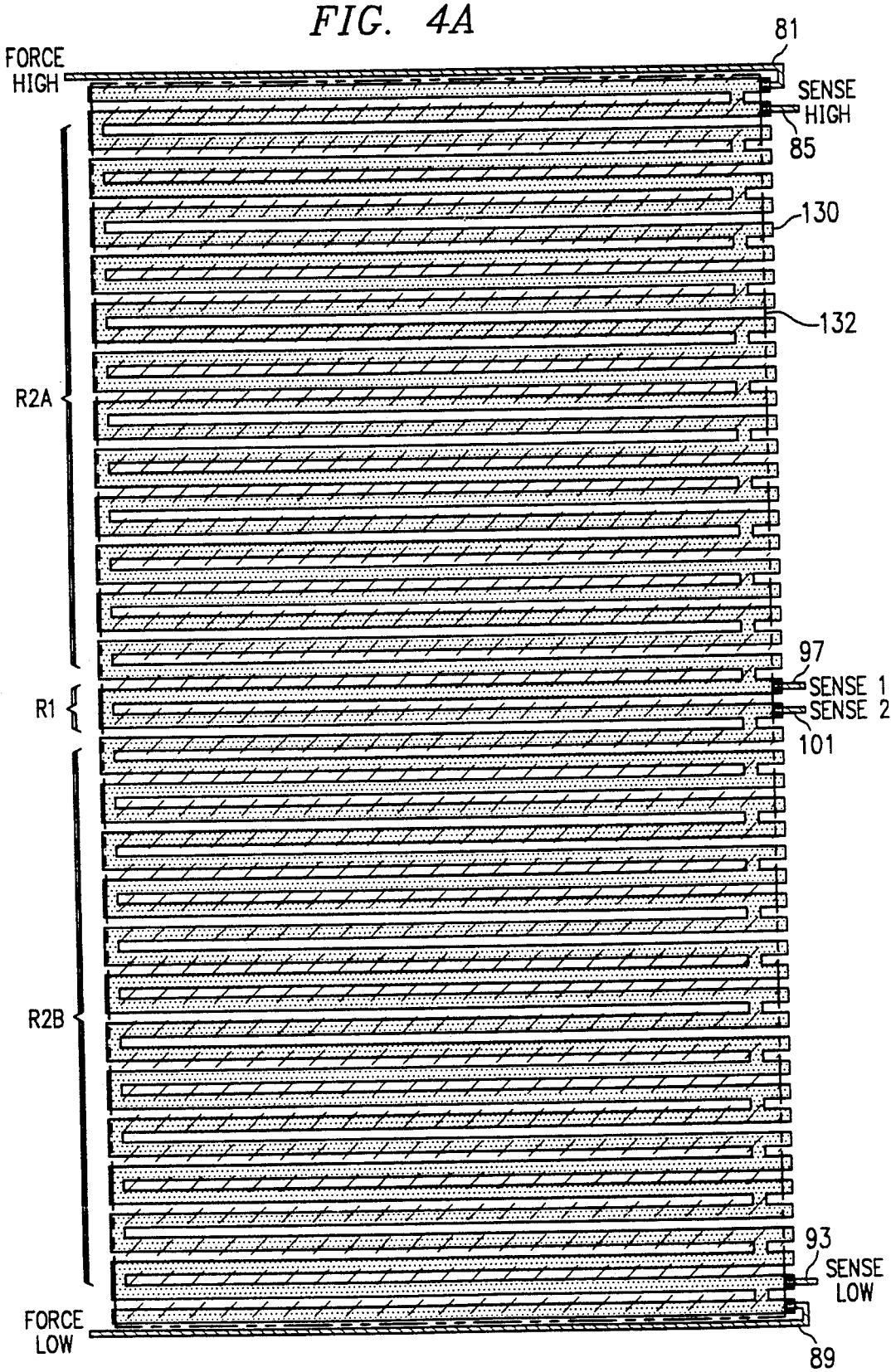
FIG. 4A is a plan view of the preferred embodiment of the resistor structure of the present invention.

FIG. 4A is a plan view of the preferred embodiment of the resistor structure according to the present invention. As shown in FIG. 4A, the preferred embodiment of the resistor structure 130 includes many more rows than the resistor structure shown in FIG. 2. These additional rows are necessary in order to provide the higher proportion of resistance of the feedback resistors R2A and R2B in relation to the bridging resistance R1 between the operational amplifiers 112 and 114.

The resistor structure 130 is of polysilicon material and has a top metallization layer plate 132 which lies on top of the resistor structure and is connected to ground to provide shielding for the resistor structure. The resistor structure lies on the field oxide region of the integrated circuit. Below the field oxide region under the resistor structure 130 is a pwel forming a second plate or shield under the resistor structure. The pwel is also connected to ground.

In the preferred embodiment of FIG. 4A the distance from the force high contact 80 to the sense high connection 82, and the distance from the force low contact 88 to the sense low connection 90 is less than 5%, and preferably less than 1%, of the distance of the main current path from the force high contact 80 to the force low contact 88.

A cross section of a portion of the resistor structure 130 is shown in FIG. 4B which shows the metal shield 132, the pwel 134, and the field oxide 136. The resistor structure is insulated from the metallization layer by an oxide layer 138.

The resistor structure 130 can also be formed in a diffused region in the substrate or in a thin film layer.

Although the invention has been described in part by making detailed reference to a certain specific embodiment, such detail is intended to be, and will be understood to be, instructional rather than restrictive. It will appreciated by those skilled in the art that many variations may be made in the structure and mode of operation without departing from the spirit and scope of the invention as disclosed in the teachings contained herein. For example, although the force and sensing connections are shown in FIG. 2 as having contacts with the metallization layer, it will be understood that these connections could also be made through buried contact to source or drain regions of transistors formed in the substrate of the integrated circuit. Moreover, if the resistive element is formed in the monocrystalline silicon substrate itself, then the resistive element could have connections which consist of source and/or drain regions of transistors.

What is claimed is:

1. A circuit and its associated low drift resistor structure in an integrated circuit comprising:
   (a) a continuous resistive element formed in a first layer of the integrated circuit and having a first end and a second end;
   (b) first and second sensing connections to said resistive element, said first sensing connection located proximate to said first end, and said second connection located proximate to said second end;
   (c) at least one additional sensing connection to said resistive element located between said first and second sensing connections;
   (d) said circuit having an output coupled to one of said first end and said second end of said resistive element for passing a current through said resistive element along a main current path from said first end to said second end; and
   (e) said circuit having at least one input coupled to, and responsive to, the voltage on said at least one additional sensing connection, said circuit controlling the current though said resistive element.

2. The circuit and resistor structure recited in claim 1 wherein substantially no current flows through said first and second, and at least one additional sensing connections.

3. A low drift integrated circuit resistor structure comprising:
   (a) a continuous resistive element formed in a first layer of the integrated circuit and having a first end and a second end;
   (b) first and second sensing connections to said resistive element, said first sensing connection located proximate to said first end, and said second connection located proximate to said second end;
   (c) at least one additional sensing connection to said resistive element located between said first and second sensing connections; and
   (d) a plate layer having a continuous sheet of conductive material positioned above said resistive element and having an area which is at least coextensive with the area occupied by said resistor structure, said plate layer being coupled to a reference voltage or ground.

4. The circuit and resistor structure recited in claim 3 wherein said plate layer is a metalization layer.

5. A low drift integrated circuit resistor structure comprising:
   (a) a continuous resistive element formed in a first layer of the integrated circuit and having a first end and a second end;
   (b) first and second sensing connections to said resistive element, said first sensing connection located proximate to said first end, and said second connection located proximate to said second end;

(c) at least one additional sensing connection to said resistive element located between said first and second sensing connections; and (d) wherein said resistor structure comprises parallel rows of continuous resistive material coupled together at alternating ends of each row by bridging bars of additional resistive material to form a continuous resistive element in a serpentine pattern, wherein said first end is in the top row at the bridging bar end of the top row, and said second end is in the bottom row at the bridging bar end of the bottom row.

6. The circuit and resistor structure recited in claim 5 wherein said first sensing connection is connected to the row that is next to the top row at the bridging bar end which connects the top row to the row that is next to the top row, and the second sensing connection is connected to the row that is next to the bottom row at the bridging bar end which connects the bottom row to the row that is next to the bottom row.

7. The circuit and resistor structure recited in claim 1 wherein (a) said first end is coupled to the output of a first operational amplifier, said first sensing connection forms a first output terminal, said second end is coupled to the output of a second operational amplifier and said second sensing connection forms a second output terminal;

(b) said at least one additional sensing connection is coupled to a first input of the first operational amplifier, and a fourth sensing connection positioned between said at least one additional sensing connection and said second sensing connection to said resistive element and coupled to a first input of said second operational amplifier; and (c) wherein a second input of said first operational amplifier receives a first input signal and a second input of said second operational amplifier receives a second input signal.

8. A low drift integrated circuit resistor structure comprising:

(a) a continuous resistive element formed in a first layer of the integrated circuit and having a first end and a second end;

(b) first and second sensing connections to said resistive element, said first sensing connection located proximate to said first end, and said second connection located proximate to said second end;

(c) at least one additional sensing connection to said resistive element located between said first and second sensing connections; and (d) a plate layer having a continuous sheet of conductive material positioned below said resistive element and having an area which is at least coextensive with the area occupied by said resistor structure, said plate layer being coupled to a reference voltage or ground.

9. The circuit and resistor structure recited in claim 8 wherein said plate layer is a well formed in the substrate of the integrated circuit.

10. The circuit and resistor structure recited in claim 1 wherein at least one of said first, second, and at least one additional sensing connection has a contact to at least one additional layer of said integrated circuit, said contact being removed from said main current path.

* * * * *